United States Patent
Wang

(10) Patent No.: US 9,899,421 B2
(45) Date of Patent: Feb. 20, 2018

(54) MANUFACTURE METHOD OF TFT SUBSTRATE AND STURCTURE THEREOF

(71) Applicant: Shenzhen China Star Optoelectronics Technology Co., Ltd., Shenzhen, Guangdong (CN)

(72) Inventor: Jun Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 90 days.

(21) Appl. No.: 14/429,779

(22) PCT Filed: Sep. 11, 2014

(86) PCT No.: PCT/CN2014/086260
§ 371 (c)(1),
(2) Date: Mar. 19, 2015

(87) PCT Pub. No.: WO2016/026179
PCT Pub. Date: Feb. 25, 2016

(65) Prior Publication Data
US 2016/0260746 A1 Sep. 8, 2016

(30) Foreign Application Priority Data
Aug. 21, 2014 (CN) .......................... 2014 1 0415944

(51) Int. Cl.
*H01L 27/12* (2006.01)
*H01L 29/45* (2006.01)
(Continued)

(52) U.S. Cl.
CPC ........ *H01L 27/1225* (2013.01); *H01L 27/124* (2013.01); *H01L 27/127* (2013.01);
(Continued)

(58) Field of Classification Search
CPC ..... H01L 29/7869; H01L 29/24; H01L 21/16; H01L 21/00; H01L 21/479; H01L 27/124;
(Continued)

(56) References Cited

U.S. PATENT DOCUMENTS 6,580,127 B1 * 6/2003 Andry ..................... H01L 27/12
257/347
2006/0102907 A1 * 5/2006 Lee ...................... H01L 27/1214
257/72
(Continued)

FOREIGN PATENT DOCUMENTS

CN 102044568 A 5/2011

*Primary Examiner* — Allen Parker
*Assistant Examiner* — Long H Le
(74) *Attorney, Agent, or Firm* — Andrew C. Cheng

(57) ABSTRACT

The present invention provides a manufacture method of an oxide semiconductor TFT substrate, and the method comprises steps of: 1, forming a gate (3) and a first heavily doped transparent conducting thin film layer (2) on a substrate (1); 2, depositing a gate isolation layer (4); 3, forming an island shaped oxide semiconductor layer (5); 4, forming an island shaped photoresistor layer (6); 5, forming a source/a drain (8), and a second, a third heavily doped transparent conducting thin film layer (7, 9), and the source/the drain (8) contact the two side parts (53) of the island shaped oxide semiconductor layer (5) via the second heavily doped transparent conducting thin film layer (7) to establish electrical connections; 6, depositing and patterning a protecting layer (10); 7, depositing and patterning a pixel electrode layer (11) which contacts the source/the drain (8) via the third heavily doped transparent conducting thin film layer (9) to establish electrical connections; 8, implementing anneal process.

8 Claims, 4 Drawing Sheets

(51) Int. Cl.
*H01L 29/49* (2006.01)
*H01L 29/66* (2006.01)
*H01L 29/417* (2006.01)
*H01L 29/423* (2006.01)
*H01L 29/786* (2006.01)

(52) U.S. Cl.
CPC .... *H01L 27/1248* (2013.01); *H01L 29/41733* (2013.01); *H01L 29/42384* (2013.01); *H01L 29/45* (2013.01); *H01L 29/4908* (2013.01); *H01L 29/66742* (2013.01); *H01L 29/66969* (2013.01); *H01L 29/7869* (2013.01); *H01L 29/78618* (2013.01)

(58) Field of Classification Search
CPC ............... H01L 27/1248; H01L 27/127; H01L 27/1225; H01L 29/41733; H01L 29/42384; H01L 29/66742; H01L 29/66969; H01L 29/78618; H01L 29/4908; H01L 29/45
See application file for complete search history.

(56) References Cited

U.S. PATENT DOCUMENTS

| | | | |
|---|---|---|---|
| 2010/0051935 A1* | 3/2010 | Lee | H01L 27/1225 257/43 |
| 2013/0171779 A1* | 7/2013 | Jeong | C09D 5/00 438/151 |
| 2014/0110705 A1* | 4/2014 | Koezuka | H01L 21/022 257/43 |
| 2014/0175424 A1 | 6/2014 | Choi | |

* cited by examiner

MANUFACTURE METHOD OF TFT SUBSTRATE AND STURCTURE THEREOF

FIELD OF THE INVENTION

The present invention relates to a display technology field, and more particularly to a manufacture method of an oxide semiconductor TFT substrate and a structure thereof.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

To be compared with a well developed TFT-LCD, an OLED based on the Organic Light Emitting Diodes is an active light emitting display, which possesses outstanding properties of self-illumination, high contrast, wide view angle (up to 170°), fast response, high luminous efficiency, low operation voltage (3-10V), ultra-thin (thickness smaller than 2 mm) and etc. The display devices utilizing OLED technology has possibility to have a lighter, thinner, charming appearance, more excellent color display quality, wider view range and greater design flexibility.

Thin Film transistors (TFT) are important components of a flat panel display which can be formed on a glass substrate or a plastic substrate. Generally, the tin film transistors are employed as light switching-on elements and driving elements utilized such as LCDs, OLEDs, Electrophoresis Displays (EPD).

The oxide semiconductor TFT technology is the most popular skill at present. Because the carrier mobility of the oxide semiconductor is 20-30 times of the amorphous silicon semiconductor. With the higher electron mobility, it is capable of magnificently raising the charging/discharging rate of TFT to the pixel electrodes to promote the response speed of the pixels and to realize faster refreshing rate. In the mean time, the line scan rate of the pixels also can be promoted to make the manufacture of the flat panel display having ultra high resolution become possible. In comparison with the Low Temperature Poly-silicon (LTPS), the oxide semiconductor manufacture process is simpler and possesses higher compatibility with the amorphous silicon process. It can be applicable to the skill fields of Liquid Crystal Display, Organic Light Emitting Display, Flexible Display and etc. Because it fits the new generation production lines and has possible applications for displays with Large, Middle and Small sizes. The oxide semiconductor has the great opportunity of application development.

In a present oxide semiconductor TFT substrate structure, the oxide semiconductor layer generally directly contacts the source/the drain in general and electrical connections are formed therebetween. However, the ohm contact resistance between the oxide semiconductor layer and the source/the drain, the ohm contact resistance between the pixel electrode layer and the source/the drain are larger and leads to higher driving voltage, higher power consumption and lower response speed of the flat panel display.

The power saving is real a required topic to the development of the present society. Making great efforts to develop low power consumption flat panel display becomes an important target to all flat panel display manufacturers.

SUMMARY OF THE INVENTION

An objective of the present invention is to provide a manufacture method of an oxide semiconductor TFT substrate capable of improving the ohm contact between the oxide semiconductor layer and the source/the drain and the ohm contact between the pixel electrode layer and the source/the drain to reduce the ohm contact resistance. The threshold voltage of the flat panel display can be reduced, and accordingly the power consumption of the flat panel display can be effectively reduced and the response speed thereof can be raised.

Another objective of the present invention is to provide an oxide semiconductor TFT substrate structure, which the ohm contact resistance between the oxide semiconductor layer and the source/the drain and the ohm contact resistance between the pixel electrode layer and the source/the drain are smaller to lower the threshold voltage of the flat panel display and the power consumption of the flat panel display and to make the response speed faster.

For realizing the aforesaid objective, the present invention provides a manufacture method of an oxide semiconductor TFT substrate, comprising steps of:

step 1, providing a substrate, and sequentially depositing and patterning a first heavily doped transparent conducting thin film layer and a first metal layer on the substrate to form a gate and the first heavily doped transparent conducting thin film layer located at a lower surface of the gate with the same shape of the gate;

step 2, deposing a gate isolation layer on the gate and the substrate;

step 3, deposing and patterning an oxide semiconductor layer on the gate isolation layer to form an island shaped oxide semiconductor layer directly over the gate;

step 4, deposing and patterning an etching stopper layer on the island shaped oxide semiconductor layer and the gate isolation layer to form an island shaped etching stopper layer on the island shaped oxide semiconductor layer;

a width of the island shaped etching stopper layer is smaller than a width of the island shaped oxide semiconductor layer; the island shaped etching stopper layer covers a central part of the island shaped oxide semiconductor layer and exposes two side parts of the island shaped oxide semiconductor layer;

step 5, sequentially deposing and patterning a second heavily doped transparent conducting thin film layer, a second metal layer and a third heavily doped transparent conducting thin film layer on the island shaped etching stopper layer and the gate isolation layer to form a source/a drain, the second heavily doped transparent conducting thin film layer located at a lower surface of the source/the drain with the same shape of the source/the drain and the third heavily doped transparent conducting thin film layer located at an upper surface of the source/the drain with the same shape of the source/the drain;

the source/the drain contact the two side parts of the island shaped oxide semiconductor layer via the second heavily doped transparent conducting thin film layer to establish electrical connections;

step 6, deposing and patterning a protecting layer on the third heavily doped transparent conducting thin film layer and the etching stopper layer to form a via located at one side of the island shaped oxide semiconductor layer;

step 7, deposing and patterning a pixel electrode layer on the protecting layer;

the pixel electrode layer fills the via and contacts the source/the drain via the third heavily doped transparent conducting thin film layer to establish electrical connections;

step 8, implementing anneal process to the substrate obtained in the seventh step.

Material of the source/the drain is copper, and material of the pixel electrode layer is ITO or IZO.

Material of the first heavily doped transparent conducting thin film layer, the second heavily doped transparent conducting thin film layer and the third heavily doped transparent conducting thin film layer is heavily doped ITO or heavily doped IZO.

Thicknesses of the first heavily doped transparent conducting thin film layer, the second heavily doped transparent conducting thin film layer and the third heavily doped transparent conducting thin film layer are respectively in a range of 5-200 nm.

The thickness of the first heavily doped transparent conducting thin film layer is 10 nm, and the thickness of the second heavily doped transparent conducting thin film layer is 15 nm, and the thickness of the third heavily doped transparent conducting thin film layer is 10 nm.

The island shaped oxide semiconductor layer is an IGZO semiconductor layer.

Material of the protecting layer is $SiO_2$ or SiON.

Operations of the patterning are accomplished by photolithography process and etching process.

The present invention further provides an oxide semiconductor TFT substrate structure, comprising a substrate, a gate on the substrate, a first heavily doped transparent conducting thin film layer at a lower surface of the gate with the same shape of the gate, a gate isolation layer on the gate and the substrate, an island shaped oxide semiconductor layer directly over the gate on the gate isolation layer, an island shaped etching stopper layer on the island shaped oxide semiconductor layer, a source/a drain on the island shaped etching stopper layer and the gate isolation layer, a second metal layer and a third heavily doped transparent conducting thin film layer at a lower surface of the source/the drain with the same shape of the source/the drain, a third heavily doped transparent conducting thin film layer located at an upper surface of the source/the drain with the same shape of the source/the drain, a protecting layer on the third heavily doped transparent conducting thin film layer and the etching stopper layer and a pixel electrode layer on the protecting layer; the island shaped oxide semiconductor layer comprises a central part and two side parts; a width of the island shaped etching stopper layer is smaller than a width of the oxide semiconductor layer and only a central part is covered; the source/the drain contact the two side parts via the second heavily doped transparent conducting thin film layer to establish electrical connections; the protecting layer comprises a via located at one side of the island shaped oxide semiconductor layer, and the pixel electrode layer fills the via and contacts the source/the drain via the third heavily doped transparent conducting thin film layer to establish electrical connections.

Material of the source/the drain is copper, material of the first heavily doped transparent conducting thin film layer, and the second heavily doped transparent conducting thin film layer and the third heavily doped transparent conducting thin film layer is heavily doped ITO or heavily doped IZO, the island shaped oxide semiconductor layer is an IGZO semiconductor layer, and material of the protecting layer is $SiO_2$ or SiON, and material of the pixel electrode layer is ITO or IZO; thicknesses of the first heavily doped transparent conducting thin film layer, the second heavily doped transparent conducting thin film layer and the third heavily doped transparent conducting thin film layer are respectively in a range of 5-200 nm.

The benefits of the present invention are: according to the manufacture method of the oxide semiconductor TFT structure of the present invention, by locating the second heavily doped transparent conducting thin film layer and the third heavily doped transparent conducting thin film layer at the upper, lower surfaces of the source/the drain, it is capable of promoting the ohm contact between the oxide semiconductor layer and the source/the drain and the ohm contact between the pixel electrode layer and the source/the drain to reduce the ohm contact resistance. The threshold voltage of the flat panel display can be reduced, and accordingly the power consumption of the flat panel display can be effectively reduced and the response speed thereof can be raised; according to the oxide semiconductor TFT structure of the present invention, with the second heavily doped transparent conducting thin film layer and the third heavily doped transparent conducting thin film layer at the upper, lower surfaces of the source/the drain, the ohm contact resistance between the oxide semiconductor layer and the source/the drain and the ohm contact resistance between the pixel electrode layer and the source/the drain can be smaller to lower the threshold voltage of the flat panel display and the power consumption of the flat panel display and to make the response speed faster.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

In order to better understand the characteristics and technical aspect of the invention, please refer to the following detailed description of the present invention is concerned with the diagrams.

Figure 1:
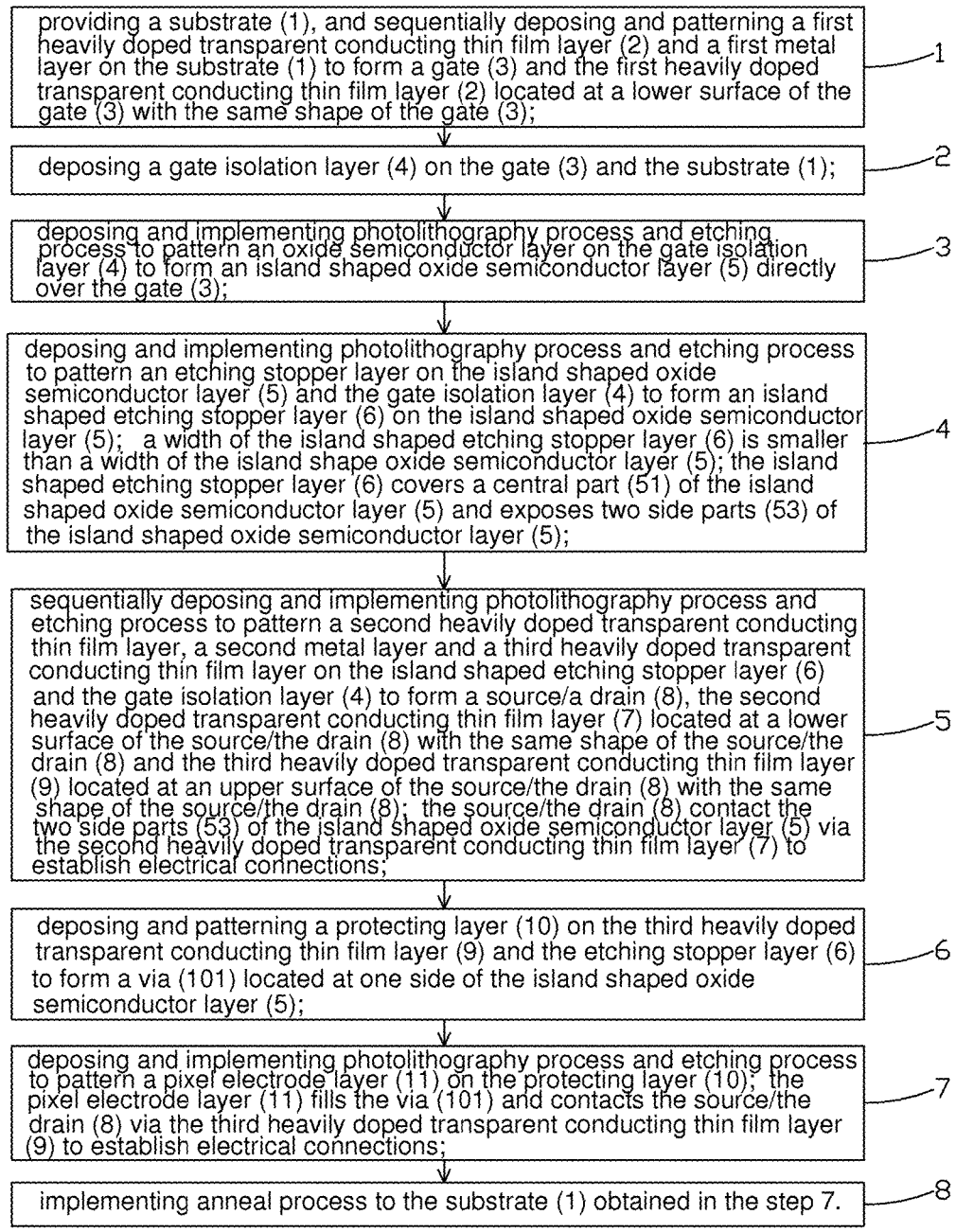
FIG. 1 is a flowchart of a manufacture method of an oxide semiconductor TFT substrate according to the present invention.
Figure 2:
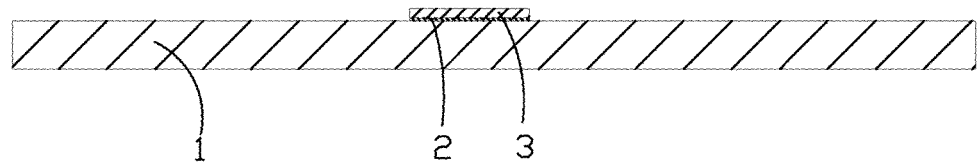
FIG. 2 is a diagram of step 1 in the manufacture method of the oxide semiconductor TFT substrate according to the present invention.

Please refer to FIG. 1, which is a flowchart of a manufacture method of an oxide semiconductor TFT substrate according to the present invention, comprising steps of:

step 1, please refer to FIG. 2, providing a substrate 1, and sequentially deposing and patterning a first heavily doped transparent conducting thin film layer 2 and a first metal layer on the substrate 1 to form a gate 3 and the first heavily doped transparent conducting thin film layer 2 located at a lower surface of the gate 3 with the same shape of the gate 3.

The substrate 1 is a transparent substrate. Preferably, the substrate 1 is a glass substrate.

In the step 1, the photolithography process is implemented with one general mask, and then the etching process is implemented to pattern the first heavily doped transparent conducting thin film layer and the first metal layer to form the gate 3 and the first heavily doped transparent conducting thin film layer 2 located at a lower surface of the gate 3 with the same shape of the gate 3.

The material of the gate 3 is copper (Cu).

Figure 3:
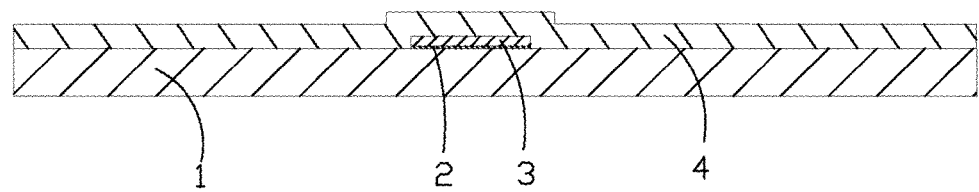
FIG. 3 is a diagram of step 2 in the manufacture method of the oxide semiconductor TFT substrate according to the present invention.

The material of the first heavily doped transparent conducting thin film layer 2 is heavily doped Indium titanium oxide (ITO) or heavily doped Indium zinc oxide (IZO). The thickness of the first heavily doped transparent conducting thin film layer 2 is in a range of 5-200 nm. Preferably, the thickness of the first heavily doped transparent conducting thin film layer 2 is 10 nm. The first heavily doped transparent conducting thin film layer 2 is capable of increasing the adhesive force between the gate 3 and the substrate 1 to improve the adhesive strength therebetween.

step 2, please refer to FIG. 3, deposing a gate isolation layer 4 on the gate 3 and the substrate 1.

Figure 4:
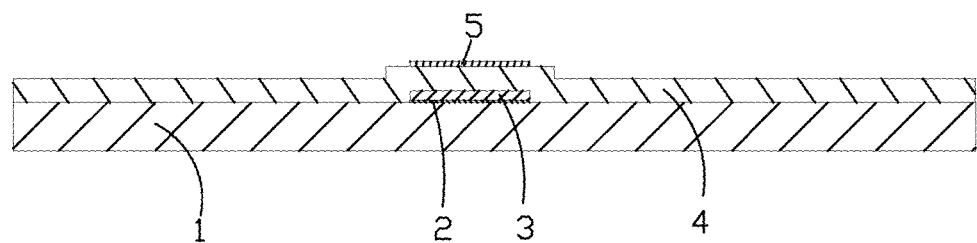
FIG. 4 is a diagram of step 3 in the manufacture method of the oxide semiconductor TFT substrate according to the present invention.

The gate isolation layer 4 covers the entire gate 3 and substrate 1.

step 3, please refer to FIG. 4, deposing and implementing photolithography process and etching process to pattern an oxide semiconductor layer on the gate isolation layer 4 to form an island shaped oxide semiconductor layer 5 directly over the gate 3.

Figure 5:
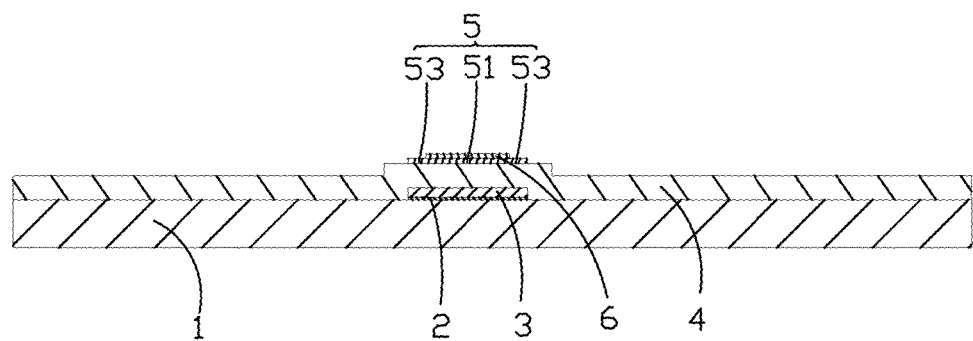
FIG. 5 is a diagram of step 4 in the manufacture method of the oxide semiconductor TFT substrate according to the present invention.

Specifically, the island shaped oxide semiconductor layer 5 is an Indium gallium zinc oxide (IGZO) semiconductor layer.

step 4, please refer to FIG. 5, deposing and implementing photolithography process and etching process to pattern an etching stopper layer on the island shaped oxide semiconductor layer 5 and the gate isolation layer 4 to form an island shaped etching stopper layer 6 on the island shaped oxide semiconductor layer 5.

Figure 6:
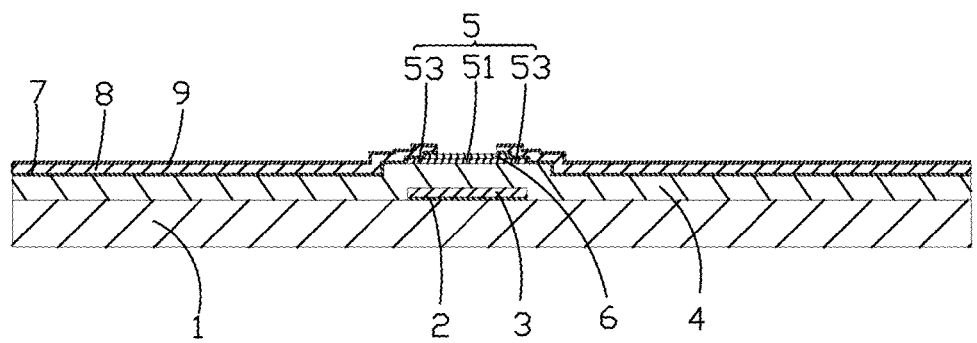
FIG. 6 is a diagram of step 5 in the manufacture method of the oxide semiconductor TFT substrate according to the present invention.

Furthermore, a width of the island shaped etching stopper layer 6 is smaller than a width of the oxide semiconductor layer 5; the island shaped etching stopper layer 6 covers a central part 51 of the island shaped oxide semiconductor layer 5 and exposes two side parts 53 of the island shaped oxide semiconductor layer 5.

step 5, please refer to FIG. 6, sequentially deposing and implementing photolithography process and etching process to pattern a second heavily doped transparent conducting thin film layer, a second metal layer and a third heavily doped transparent conducting thin film layer on the island shaped etching stopper layer 6 and the gate isolation layer 4 to form a source/a drain 8, the second heavily doped transparent conducting thin film layer 7 located at a lower surface of the source/the drain 8 with the same shape of the source/the drain 8 and the third heavily doped transparent conducting thin film layer 9 located at an upper surface of the source/the drain 8 with the same shape of the source/the drain 8.

Specifically, material of the second and the third heavily doped transparent conducting thin film layer 7, 9 is heavily doped ITO or heavily doped IZO; and the thicknesses of the second and the third heavily doped transparent conducting thin film layer 7, 9 are respectively in a range of 5-200 nm, and preferably, the thickness of the second heavily doped transparent conducting thin film layer 7 is 15 nm, and the thickness of the third heavily doped transparent conducting thin film layer 9 is 10 nm.

The material of the source/the drain 8 is Cu.

Figure 7:
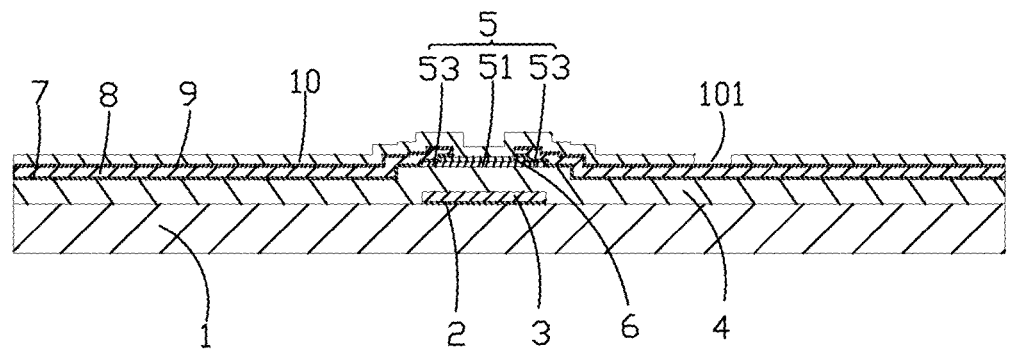
FIG. 7 is a diagram of step 6 in the manufacture method of the oxide semiconductor TFT substrate according to the present invention.

The source/the drain 8 contact the two side parts 53 of the island shaped oxide semiconductor layer 5 via the second heavily doped transparent conducting thin film layer 7 to establish electrical connections. The second heavily doped transparent conducting thin film layer 7 has stronger conducting ability. As it is employed as a contact transition layer, the ohm contact resistance between the source/the drain 8 and the island shaped oxide semiconductor layer 5 can be effectively reduced. Accordingly, the threshold voltage of the flat panel display and the power consumption of the flat panel display can be lowered to realize the objective of raising the response speed.

step 6, please refer to FIG. 7, deposing and patterning a protecting layer 10 on the third heavily doped transparent conducting thin film layer 9 and the etching stopper layer 6 to form a via 101 located at one side of the island shaped oxide semiconductor layer 5.

Figure 8:
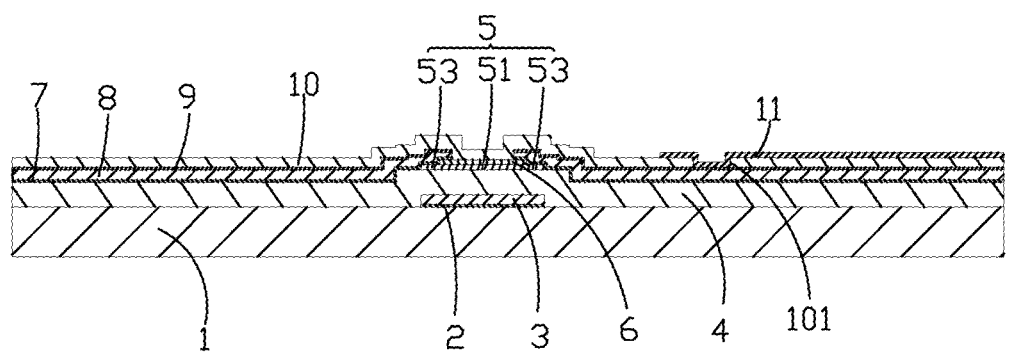
FIG. 8 is a diagram of step 7 in the manufacture method of the oxide semiconductor TFT substrate according to the present invention and a diagram of the oxide semiconductor TFT substrate structure according to the present invention.

Specifically, the material of the protecting layer 10 is silicon dioxide ($SiO_2$) or silicon oxynitride (SiON).

step 7, please refer to FIG. 8, deposing and implementing photolithography process and etching process to pattern a pixel electrode layer 11 on the protecting layer 10.

Specifically, the material of the pixel electrode layer 11 is ITO or IZO.

The pixel electrode layer 11 fills the via 101 and contacts the source/the drain 8 via the third heavily doped transparent conducting thin film layer 9 to establish electrical connections. The third heavily doped transparent conducting thin film layer 9 has stronger conducting ability. As it is employed as a contact transition layer, the ohm contact resistance between the source/the drain 8 and the pixel electrode layer 11 can be effectively reduced. Accordingly, the threshold voltage of the flat panel display and the power consumption of the flat panel display can be lowered to realize the objective of raising the response speed.

step 8, implementing anneal process to the substrate 1 obtained in the step 7 to accomplish the manufacture of the oxide semiconductor TFT substrate.

Please refer to FIG. 8. On the basis of the aforesaid manufacture method of the oxide semiconductor TFT substrate, the present invention further provides an oxide semiconductor TFT substrate structure, comprising a substrate 1, a gate 3 on the substrate 1, a first heavily doped transparent conducting thin film layer at a lower surface of the gate with the same shape of the gate, a gate isolation layer 4 on the gate 3 and the substrate 1, an island shaped oxide semiconductor layer 5 directly over the gate 3 on the gate isolation layer 4, an island shaped etching stopper layer 6 on the island shaped oxide semiconductor layer 5, a source/a drain 8 on the island shaped etching stopper layer 6 and the gate isolation layer 4, a third heavily doped transparent conducting thin film layer 7 at a lower surface of the source/the drain 8 with the same shape of the source/the drain 8, a third heavily doped transparent conducting thin film layer 9 located at an upper surface of the source/the drain 8 with the same shape of the source/the drain 8, a protecting layer 10 on the third heavily doped transparent conducting thin film layer 9 and the etching stopper layer 6 and a pixel electrode layer 11 on the protecting layer 10.

The island shaped oxide semiconductor layer 5 comprises a central part 51 and two side parts 53, a width of the island shaped etching stopper layer 6 is smaller than a width of the oxide semiconductor layer 5 and only a central part 51 is covered. The source/the drain 8 contact the two side parts 53 via the second heavily doped transparent conducting thin film layer 7 to establish electrical connections. The ohm contact resistance between the oxide semiconductor layer 5 and the source/the drain 8 can be smaller to reduce the threshold voltage and the power consumption of the flat panel display accordingly. The response speed can be faster. The protecting layer 10 comprises a pixel electrode via 101 located at one side of the island shaped oxide semiconductor layer 5, and the pixel electrode layer 11 fills the via 101 and contacts the source/the drain 8 via the third heavily doped transparent conducting thin film layer 9 to establish electrical connections. The ohm contact resistance between the pixel electrode layer 11 and the source/the drain 8 can be smaller to reduce the threshold voltage and the power consumption of the flat panel display accordingly. The response speed can be faster.

Specifically, material of the gate 3 and the source/the drain 8 is copper, material of the first heavily doped transparent conducting thin film layer 2, and the second heavily doped transparent conducting thin film layer 7 and the third heavily doped transparent conducting thin film layer 9 is heavily doped ITO or heavily doped IZO; the island shaped oxide semiconductor layer 5 is an IGZO semiconductor layer, and material of the protecting layer 10 is $SiO_2$ or SiON; material of the pixel electrode layer is ITO or IZO; thicknesses of the first heavily doped transparent conducting thin film layer 2, the second heavily doped transparent conducting thin film layer 7 and the third heavily doped transparent conducting thin film layer 9 are respectively in a range of 5-200 nm. Preferably, the thickness of the first heavily doped transparent conducting thin film layer 2 is 10 nm, and the thickness of the second heavily doped transparent conducting thin film layer 7 is 15 nm, and the thickness of the third heavily doped transparent conducting thin film layer 9 is 10 nm.

In conclusion, according to the manufacture method of the oxide semiconductor TFT structure of the present invention, by locating the second heavily doped transparent conducting thin film layer and the third heavily doped transparent conducting thin film layer at the upper, lower surfaces of the source/the drain, it is capable of promoting the ohm contact between the oxide semiconductor layer and the source/the drain and the ohm contact between the pixel electrode layer and the source/the drain to reduce the ohm contact resistance. The threshold voltage of the flat panel display can be reduced, and accordingly the power consumption of the flat panel display can be effectively reduced and the response speed thereof can be raised; according to the oxide semiconductor TFT structure of the present invention, with the second heavily doped transparent conducting thin film layer and the third heavily doped transparent conducting thin film layer at the upper, lower surfaces of the source/the drain, the ohm contact resistance between the oxide semiconductor layer and the source/the drain and the ohm contact resistance between the pixel electrode layer and the source/the drain can be smaller to lower the threshold voltage of the flat panel display and the power consumption of the flat panel display and to make the response speed faster.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an oxide semiconductor TFT substrate, comprising steps of:
   step 1, providing a substrate, and sequentially depositing and patterning a first heavily doped transparent conducting thin film layer and a first metal layer on the substrate to form a gate and the first heavily doped transparent conducting thin film layer located at a lower surface of the gate with the same shape of the gate;
   step 2, depositing a gate isolation layer on the gate and the substrate;
   step 3, depositing and patterning an oxide semiconductor layer on the gate isolation layer to form an island shaped oxide semiconductor layer directly over the gate;
   step 4, depositing and patterning an etching stopper layer on the island shaped oxide semiconductor layer and the gate isolation layer to form an island shaped etching stopper layer on the island shaped oxide semiconductor layer;
   a width of the island shaped etching stopper layer is smaller than a width of the island shaped oxide semiconductor layer; the island shaped etching stopper layer covers a central part of the island shaped oxide semiconductor layer and exposes two side parts of the island shaped oxide semiconductor layer;
   step 5, sequentially depositing and patterning a second heavily doped transparent conducting thin film layer, a second metal layer and a third heavily doped transparent conducting thin film layer on the island shaped etching stopper layer and the gate isolation layer to form a source/a drain, the second heavily doped transparent conducting thin film layer located at a lower surface of the source/the drain with the same shape of the source/the drain and the third heavily doped transparent conducting thin film layer located at an upper surface of the source/the drain with the same shape of the source/the drain;
   the source/the drain contact the two side parts of the island shaped oxide semiconductor layer via the second heavily doped transparent conducting thin film layer to establish electrical connections such that the second heavily doped transparent conducting thin film layer of the source/the drain is in direct contact with the two side parts of the island shaped oxide semiconductor layer to reduce ohm contact resistance between the source/the drain and the island shaped oxide semiconductor layer;
   step 6, depositing and patterning a protecting layer on the third heavily doped transparent conducting thin film layer and the etching stopper layer to form a via located at one side of the island shaped oxide semiconductor layer;
   step 7, depositing and patterning a pixel electrode layer on the protecting layer;
   the pixel electrode layer fills the via and contacts the source/the drain via the third heavily doped transparent conducting thin film layer such that the third heavily doped transparent conducting thin film layer of the source/the drain is in direct contact with the pixel electrode to establish electrical connection therebetween the source/drain and the pixel electrode with reduced ohm contact resistance between the source/the drain and the pixel electrode;

step 8, implementing anneal process to the substrate obtained in the seventh step.

2. The manufacture method of the oxide semiconductor TFT substrate according to claim 1, wherein material of the source/the drain is copper and material of the pixel electrode layer is ITO or IZO.

3. The manufacture method of the oxide semiconductor TFT substrate according to claim 1, wherein material of the first heavily doped transparent conducting thin film layer, the second heavily doped transparent conducting thin film layer and the third heavily doped transparent conducting thin film layer is heavily doped ITO or heavily doped IZO.

4. The manufacture method of the oxide semiconductor TFT substrate according to claim 3, wherein thicknesses of the first heavily doped transparent conducting thin film layer, the second heavily doped transparent conducting thin film layer and the third heavily doped transparent conducting thin film layer are respectively in a range of 5-200 nm.

5. The manufacture method of the TFT substrate according to claim 4, wherein the thickness of the first heavily doped transparent conducting thin film layer is 10 nm, and the thickness of the second heavily doped transparent conducting thin film layer is 15 nm, and the thickness of the third heavily doped transparent conducting thin film layer is 10 nm.

6. The manufacture method of the oxide semiconductor TFT substrate according to claim 1, wherein the island shaped oxide semiconductor layer is an IGZO semiconductor layer.

7. The manufacture method of the oxide semiconductor TFT substrate according to claim 1, wherein material of the protecting layer is $SiO_2$ or SiON.

8. The manufacture method of the oxide semiconductor TFT substrate according to claim 1, wherein operations of the patterning are accomplished by photolithography process and etching process.

\* \* \* \* \*